United States Patent
Kwan et al.

(10) Patent No.: US 10,756,101 B2
(45) Date of Patent: *Aug. 25, 2020

(54) NAND MEMORY CELL STRING HAVING A STACKED SELECT GATE STRUCTURE AND PROCESS FOR FOR FORMING SAME

(71) Applicant: Cypress Semiconductor Corporation, San Jose, CA (US)

(72) Inventors: Ming Sang Kwan, San Leandro, CA (US); Shenqing Fang, Sunnyvale, CA (US); Youseok Suh, Cupertino, CA (US); Michael A. Van Buskirk, Saratoga, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/747,067

(22) Filed: Jan. 20, 2020

(65) Prior Publication Data

US 2020/0168618 A1    May 28, 2020

Related U.S. Application Data

(63) Continuation of application No. 16/452,106, filed on Jun. 25, 2019, now Pat. No. 10,566,341, which is a (Continued)

(51) Int. Cl.
*G11C 16/04* (2006.01)
*G11C 16/14* (2006.01)
(Continued)

(52) U.S. Cl.
CPC ...... *H01L 27/1157* (2013.01); *G11C 16/0483* (2013.01); *G11C 16/14* (2013.01); (Continued)

(58) Field of Classification Search
CPC ..... G11C 16/0483; G11C 16/14; G11C 16/16; G11C 16/04; G11C 16/0466
See application file for complete search history.

(56) References Cited

U.S. PATENT DOCUMENTS

| | | |
|---|---|---|
| 3,967,988 A | 7/1976 | Davidsohn |
| 4,222,062 A | 9/1980 | Trotter et al. |

(Continued)

OTHER PUBLICATIONS

USPTO Advisory Action for U.S. Appl. No. 12/489,226 dated Oct. 5, 2015; 5 pages.
(Continued)

*Primary Examiner* — Hien N Nguyen

(57) ABSTRACT

A memory string is disclosed including a plurality of core cells serially connected between a source select gate and a drain select gate along a channel. Each core cell includes a wordline separated from the channel by a stack of layers including a charge trapping layer. At least one of the source and drain select gates is a stacked select gate with a plurality of components, including a first component adjacent to the plurality of core cells and a second component separated from the core cells by the first component. The first component includes a wordline separated from the channel by a stack of layers including a charge trapping layer, and a distance between the wordline of the first component and the wordline of a first core cell in the plurality of core cells is substantially the same as distances between each wordline in the plurality of word core cells.

20 Claims, 12 Drawing Sheets

Related U.S. Application Data continuation of application No. 16/029,440, filed on Jul. 6, 2018, now Pat. No. 10,361,215, which is a continuation of application No. 15/277,819, filed on Sep. 27, 2016, now Pat. No. 10,038,004, which is a continuation-in-part of application No. 12/489,226, filed on Jun. 22, 2009, now abandoned.

(51) Int. Cl.
| | |
|---|---|
| *H01L 27/1157* | (2017.01) |
| *H01L 27/11582* | (2017.01) |
| *H01L 29/51* | (2006.01) |
| *H01L 29/16* | (2006.01) |
| *H01L 23/528* | (2006.01) |
| *G11C 16/16* | (2006.01) |
| *H01L 29/04* | (2006.01) |

(52) U.S. Cl.
CPC ............ *G11C 16/16* (2013.01); *H01L 23/528* (2013.01); *H01L 27/11582* (2013.01); *H01L 29/04* (2013.01); *H01L 29/16* (2013.01); *H01L 29/513* (2013.01); *H01L 29/518* (2013.01); *Y10T 29/49002* (2015.01)

(56) References Cited

U.S. PATENT DOCUMENTS

| | | | |
|---|---|---|---|
| 4,511,813 A | 4/1985 | Pan | |
| 5,114,724 A | 5/1992 | Bottero | |
| 5,698,879 A | 12/1997 | Aritome et al. | |
| 5,955,765 A | 9/1999 | Yamazaki et al. | |
| 6,172,915 B1 | 1/2001 | Tang et al. | |
| 6,243,295 B1 | 6/2001 | Satoh | |
| 6,411,548 B1 | 6/2002 | Sakui et al. | |
| 6,845,042 B2 | 1/2005 | Ichige et al. | |
| 7,098,755 B2 | 8/2006 | Zhao et al. | |
| 7,382,652 B2 | 6/2008 | Shiga et al. | |
| 7,440,326 B2 | 10/2008 | Ito | |
| 7,470,948 B2 | 12/2008 | Park et al. | |
| 7,498,630 B2 | 3/2009 | Ichige et al. | |
| 7,502,261 B2 | 3/2009 | Harari | |
| 7,505,321 B2 | 3/2009 | Scheuerlein et al. | |
| 7,508,710 B2 | 3/2009 | Mokhlesi | |
| 7,571,276 B2 | 8/2009 | Cho et al. | |
| 7,638,834 B2 | 12/2009 | Harari | |
| 7,675,117 B2 | 3/2010 | Atanackovic | |
| 7,684,245 B2 | 3/2010 | Schumann et al. | |
| 7,691,710 B2 | 4/2010 | Mokhlesi et al. | |
| 7,982,243 B1 | 7/2011 | Iversen et al. | |
| 8,385,122 B2 | 2/2013 | Kim et al. | |
| 10,038,004 B2 * | 7/2018 | Kwan ............... | H01L 29/16 |
| 10,361,215 B2 | 7/2019 | Kwan et al. | |
| 10,566,341 B2 * | 2/2020 | Kwan ............... | H01L 29/04 |
| 2010/0322006 A1 | 12/2010 | Kwan et al. | |
| 2013/0286735 A1 | 10/2013 | Hwang et al. | |

OTHER PUBLICATIONS

USPTO Examiner Initiated Interview Summary for U.S. Appl. No. 12/489,226 dated Jul. 20, 2015; 1 page.
USPTO Final Rejection for U.S. Appl. No. 12/489, 226 dated Jul. 20, 2015; 13 pages.
USPTO Final Rejection for U.S. Appl. No. 12/489,226 dated Feb. 19, 2014; 12 pages.
USPTO Final Rejection for U.S. Appl. No. 12/489,226 dated Feb. 20, 2013; 10 pages.
USPTO Final Rejection for U.S. Appl. No. 12/489,226 dated Mar. 14, 2012; 11 pages.
USPTO Final Rejection for U.S. Appl. No. 12/489,226 dated Apr. 18, 2014;13 pages.
USPTO Final Rejection for U.S. Appl. No. 12/489,226 dated Sep. 4, 2014; 11 pages.
USPTO Final Rejection for U.S. Appl. No. 12/489,226 dated Sep. 5, 2013; 12 pages.
USPTO Final Rejection for U.S. Appl. No. 12/489,226 dated Sep. 16, 2011; 8 pages.
USPTO Final Rejection for U.S. Appl. No. 12/489,226 dated Sep. 25, 2012; 11 pages.
USPTO Final Rejection for U.S. Appl. No. 12/489,226 dated Nov. 4, 2010; 8 pages.
USPTO Final Rejection for U.S. Appl. No. 12/489,226 dated Nov. 20, 2014; 8 pages.
USPTO Final Rejection for U.S. Appl. No. 12/489,226 dated Mar. 29, 2016; 17 pages.
USPTO Non-Final Rejection for U.S. Appl. No. 12/489,226 dated Jan. 5, 2012; 8 pages.
USPTO Non-Final Rejection for U.S. Appl. No. 12/489,226 dated Mar. 25, 2015; 10 pages.
USPTO Non-Final Rejection for U.S. Appl. No. 12/489,226 dated Apr. 29, 2011; 7 pages.
USPTO Non-Final Rejection for U.S. Appl. No. 12/489,226 dated Jun. 3, 2014; 10 pages.
USPTO Non-Final Rejection for U.S. Appl. No. 12/489,226 dated Jun. 4, 2013; 11 pages.
USPTO Non-Final Rejection for U.S. Appl. No. 12/489,226 dated Jul. 9, 2012; 12 pages.
USPTO Non-Final Rejection for U.S. Appl. No. 12/489,226 dated Aug. 30, 2010; 7 pages.
USPTO Non-Final Rejection for U.S. Appl. No. 12/489,226 dated Nov. 6, 2012; 8 pages.
USPTO Non-Final Rejection for U.S. Appl. No. 12/489,226 dated Nov. 18, 2013; 10 pages.
USPTO Non-Final Rejection for U.S. Appl. No. 15/277,819 dated Feb. 9, 2018; 7 pages.
USPTO Non-Final Rejection for U.S. Appl. No. 12/489,226 dated Nov. 4, 2015; 15 pages.
USPTO Non-Final Rejection for U.S. Appl. No. 16/452,106 dated Sep. 9, 2019; 6 pages.
USPTO Notice of Allowance for U.S. Appl. No. 15/277,819 dated Mar. 28, 2018; 8 pages.
USPTO Notice of Allowance for U.S. Appl. No. 16/029,440 dated Apr. 8, 2019; 9 pages.
USPTO Notice of Allowance for U.S. Appl. No. 16/452,106 dated Oct. 29, 2019; 8 pages.
USPTO Requirement for Restriction Election for U.S. Appl. No. 15/277,819 dated Jun. 29, 2017; 7 pages.
USPTO Requirement for Restriction Election for U.S. Appl. No. 16/029,440 dated Nov. 2, 2018; 8 pages.

* cited by examiner

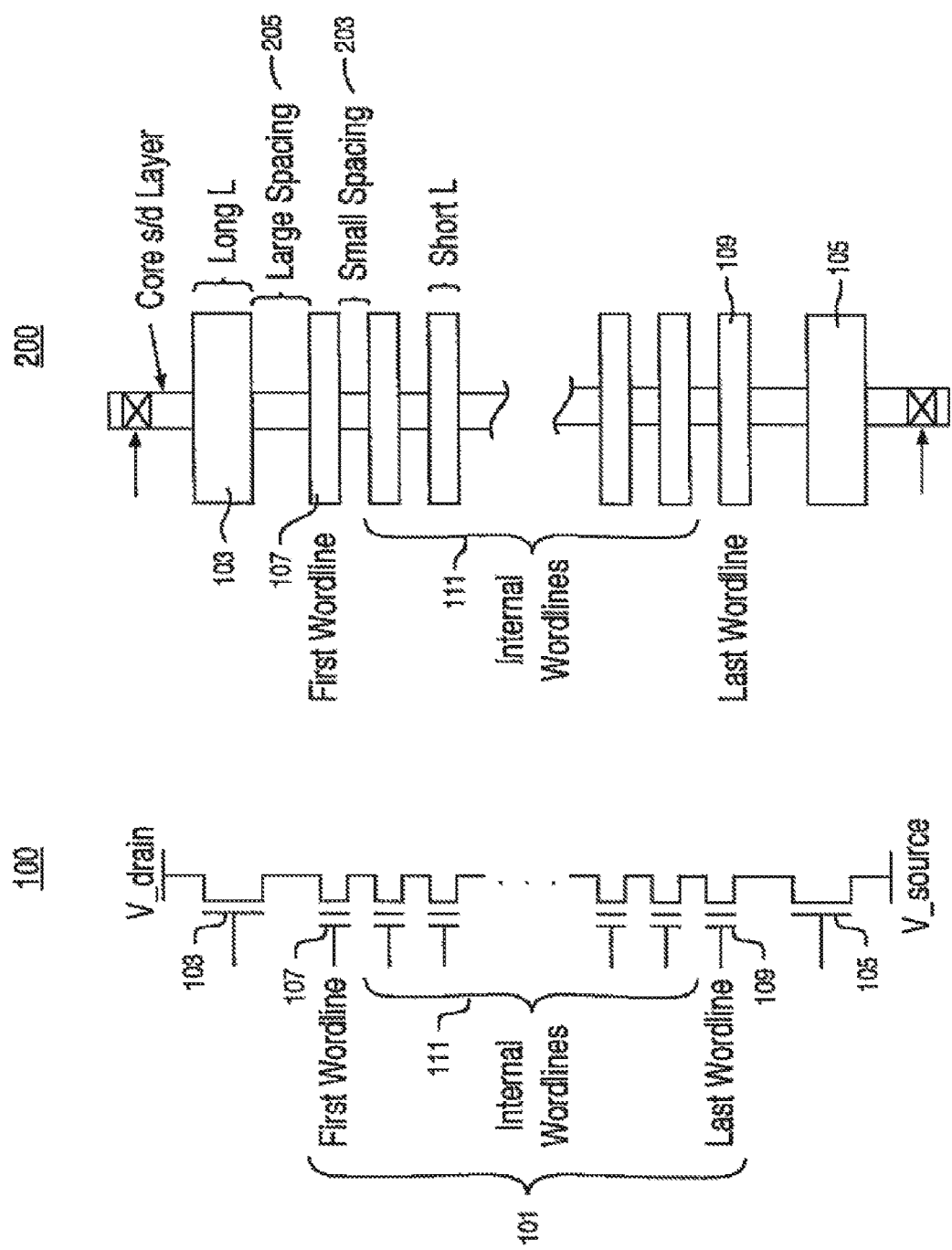

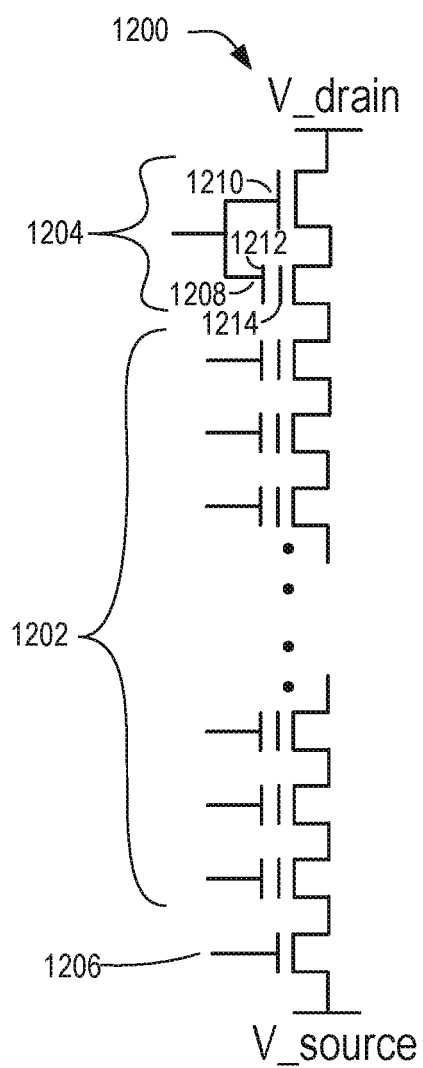
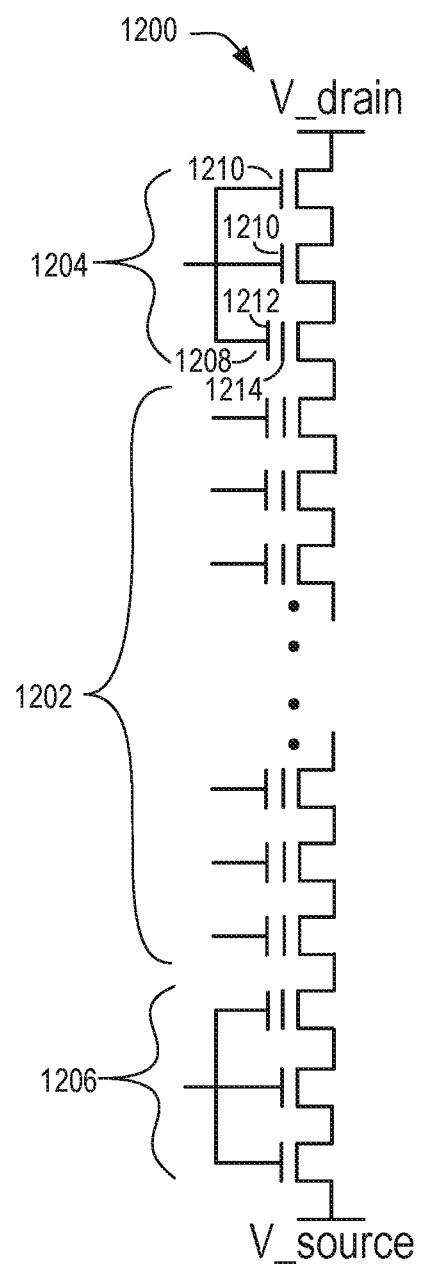
Figure 12A
Figure 12B

NAND MEMORY CELL STRING HAVING A STACKED SELECT GATE STRUCTURE AND PROCESS FOR FOR FORMING SAME

CROSS-REFERENCE TO RELATED APPLICATIONS

This application is a Continuation of U.S. patent application Ser. No. 16/452,106, filed Jun. 25, 2019, now U.S. Pat. No. 10,566,341, issued Feb. 18, 2020, which is a Continuation of U.S. patent application Ser. No. 16/029,440, filed Jul. 6, 2018, now U.S. Pat. No. 10,361,215, issued Jul. 23, 2019, which is a Continuation of U.S. patent application Ser. No. 15/277,819, filed Sep. 27, 2016, now U.S. Pat. No. 10,038,004, issued Jul. 31, 2018, which is a Continuation-in-Part of U.S. patent application Ser. No. 12/489,226, filed Jun. 22, 2009, now Abandoned, all of which are incorporated by reference herein in their entirety.

TECHNICAL FIELD

The present invention relates to the fabrication of memory cells.

BACKGROUND

Flash memory is non-volatile computer memory that can be electrically erased and reprogrammed. Flash memory is primarily used in memory cards and USB flash drives for general storage and transfer of data between computers and other digital products. Flash memory is a specific type of EEPROM (Electrically Erasable Programmable Read-Only Memory) that is erased and programmed in large blocks. Example applications include data storage for PDAs (personal digital assistants), laptop computers, digital audio players, digital cameras and mobile phones. Other applications include game consoles, where flash memory can be used instead of EEPROMs or battery-powered SRAM for game save data.

NAND type flash memory is one of two types of flash memory technologies (the other being NOR) that are currently available. NAND type flash memory is best suited for use in flash devices requiring high capacity data storage. NAND type flash memory offers significant storage space and offers faster erase, write, and read capabilities as compared to NOR type flash memory. FIGS. 1-4 show schematic, layout and cross sectional illustrations respectively of a memory cell string that is a part of a conventional NAND type flash memory device.

FIG. 1 shows a schematic representation of a NAND string 100 that features a conventional select gate structure. In FIG. 1 NAND string 100 has a defined number of wordlines 101 (16, 32, or 64 depending on product design) disposed between a "drain select gate" 103 at one end of the string structure and a "source select gate" 105 at the other end of the string structure. In the NAND string shown in FIG. 1, wordlines 101 include first wordline 107, last wordline 109 and internal wordlines 111. Drain select gate 103 is used to select wordlines 111 during read, program and erase operations. Drain select gate 103 must be a low leakage device such that, for example during read operations, leakage current that can be difficult to distinguish from memory cell current can be reduced (during programming the low leakage drain select gate can prevent the discharge of cells). Conventional NAND string 100 possesses features that affect its operation such as a significant difference in the pitch that exists between its select gates 103 and 105 and its first and last wordlines 107 and 109 (which is the same) and the pitch that exists between individual wordlines of internal wordlines 111.

FIG. 2 shows a layout view 200 of NAND string 100 shown in FIG. 1 that illustrates some of the spacing relationships that are featured by NAND string 100. FIG. 2 shows in addition to elements shown in FIG. 1 spacing 203, between internal wordlines 111, and spacing 205, between first and last wordlines 107 and 109 and adjacent select gates 103 and 105. Referring to FIG. 2, it should be appreciated that due to a the need to suppress hot carrier injection that can cause disturbs during write operations, the spacing 205 between the first and last wordlines 107 and 109 and their adjacent select gates 103 and 107, is formed to be much larger, e.g., 90-100 nm, than the spacing 203 between internal wordlines 111 that are located between the first and last wordlines 107 and 109 of NAND string 100 (e.g. spacing between first and second wordline, third and fourth wordline, etc.). It should be appreciated that the 90 nm-100 nm space between first and last wordlines 107 and 109 and their adjacent select gates must be maintained even when the space between internal wordlines is scaled down from 45 nm (e.g., 32 nm, 22 nm, etc.).

FIG. 3 shows a cross sectional view of NAND string 100 shown in FIG. 2 sectioned along a core source drain direction that further illustrates the component spacing relationships featured by NAND string 100. FIG. 3 shows in addition to elements shown in FIGS. 1 and 2, components of the source-drain junction 301. Referring to FIG. 3, as discussed with reference to FIG. 2, NAND string 100 features a much larger spacing 205 between first and last wordlines 107 and 109 and their adjacent select gates 103 and 105 than the spacing 203 between internal wordlines 111. It should be appreciated that the aforementioned difference in the length of the space that exists between the first and last wordlines 107 and 109 and their adjacent select gates 103 and 105 and the length of the space that exist between the internal wordlines 111 of NAND string 100 has a deleterious affect on the bias conditions of NAND string 100 as is discussed below with reference to FIG. 4.

FIG. 4 illustrates deleterious aspects of bias conditions of conventional NAND string 100 during memory cell erase operations. Referring to FIG. 4, first word line 107 and last word line 109 are situated between neighboring wordlines 405 and 407 and neighboring select gates 103 and 105. As shown in FIG. 4, during erase operations, neighboring wordlines 405 and 407 are biased at the same potential as are first and last wordline 107 and 109, while neighboring select gates 103 and 105 are floated. During erase, the electrical environment that first and last wordlines 107 and 109 are subjected to is impacted by not only the floating gates but electrical coupling from the associated P-well (not shown) that can cause fringing (labeled "X" in FIG. 4) that weakens the electric field that is applied to the first and last wordlines 107 and 109. This condition can result in a much slower erase rate for cells associated with the first and last wordlines 107 and 109 than for cells associated with internal wordlines 111. These differences in erase rates serve to degrade the operation of the associated memory device.

The above discussed erase rate differences are traceable to the non-uniformity of the electric field on one side of first and last wordlines 107 and 109 that is attributable to the factors discussed above. Moreover, it should be appreciated that the erase voltage that is applied via select gate 103 during erase operations is global in nature which results in the same voltage being applied to all wordlines. Thus, to enable first and last wordlines 107 and 109 to pass erase verify, the internal wordlines 111 will need to be significantly over-erased to compensate for the slower erase rate of first and last wordlines 107 and 109. Although. NAND architecture is more forgiving of memory cell over erasure than some other types of memory, significant memory cell over erasure can lead to reliability issues after cycling. It should be appreciated that placing the select gates closer to the wordlines in the conventional design only aggravates the above discussed problems.

A consequence of the large spacing that exists between first and last wordlines 107 and 109 and their neighboring select gates 103 and 105 is manifested in the fab-out Vt of first and last wordlines 107 and 109. More specifically, as a result of the large spacing between first and last wordlines 107 and 109 and their neighboring select gates 103 and 105, the fab-out Vt of first and last wordlines 107 and 109 may be significantly different from the fab-out Vt of the internal word lines 111. Accordingly, the operating characteristics of the transistors that are associated with first and last wordlines 107 and 109 are different from the operating characteristics of the transistors associated with internal wordlines 111. It should be appreciated that the transistors that perform poorest can cause a significant expenditure of operating margin and thus must be compensated for.

A conventional approach to remedying the above discussed fab-out Vt differences is to make the physical length of first and last wordlines 107 and 109 different from the physical length of the internal wordlines 111 using photolithography processes. One such photolithography process is optical proximity correction (OPC). However, optical proximity correction cannot assure uniform Vt distribution from the wordlines in the NAND string after electrical erase. Accordingly, such attempts to compensate for differences in transistor operating characteristics do not avoid the loss of some margin.

Other consequences of the large spacing between the first and last wordlines 107 and 109 of a NAND string 100 and their neighboring select gates 103 and 105 relate to NAND string processing. In particular, to double patterning photolithography processes. It should be appreciated that double patterning photolithography can be an issue as double patterning photolithography may be required to achieve sub-lithographic component dimensions. Double patterning photolithography allows printing at dimensions below that which ordinary photolithography can achieve (e.g., below 45 nm). However, the non-uniform poly spacing show in FIG. 4 between the select gates 103 and 105 and first and last wordlines 107 and 109 of NAND string 100 are very difficult to manage using double patterning photolithography. Consequently, a patterning technique that may be critical to the achievement of smaller device dimensions can be complicated because of the larger spacing that exists between the select gates 103 and 105 and the first and last wordlines 107 and 109 of a conventional NAND string 100 as compared to that which exists between each of the internal wordlines 111 of the conventional NAND string 100.

As is clear from the above discussion, features of the design of conventional NAND strings affect both their fabrication and performance. Moreover, conventional techniques for addressing these problems are unsatisfactory as they can result in reliability problems, can aggravate existing problems and do not avoid the loss of margin.

SUMMARY

A memory string is disclosed including a plurality of core cells serially connected between a source select gate and a drain select gate along a channel. Each core cell includes a wordline separated from the channel by a stack of layers including a charge trapping layer. At least one of the source and drain select gates is a stacked select gate with a plurality of components, including a first component adjacent to the plurality of core cells and a second component separated from the core cells by the first component. The first component includes a wordline separated from the channel by a stack of layers including a charge trapping layer, and a distance between the wordline of the first component and the wordline of a first core cell in the plurality of core cells is substantially the same as distances between each wordline in the plurality of word core cells.

Generally, the stack of layers in the first component has the same stoichiometric composition and thicknesses as the stack of layers in each core cell in the plurality of core cells. In one embodiment, the stack of layers in the first component and in each core cell includes an oxide-nitride-oxide (ONO) stack.

BRIEF DESCRIPTION OF THE DRAWINGS

Embodiments of the present invention are illustrated by way of example, and not limitation, in the figures of the accompanying drawings in which:

FIG. 1 shows a schematic representation of a conventional NAND string that features a single select gate structure.

FIG. 2 shows a layout view of the conventional NAND string shown in FIG. 1.

FIG. 12A shows a schematic representation of a 3D NAND string having a double non-even stacked select gate according to one embodiment.

FIG. 12B shows a schematic representation of a 3D NAND string having a triple even stacked select gate according to one embodiment.

It should be noted that like reference numbers refer to like elements in the figures.

DETAILED DESCRIPTION

The present invention will now be described in detail with reference to a various embodiments thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention.

Nand Memory Cell String Having a Stacked Select Gate Structure

Double Non-Even Stacked Select Gate

Figure 3:
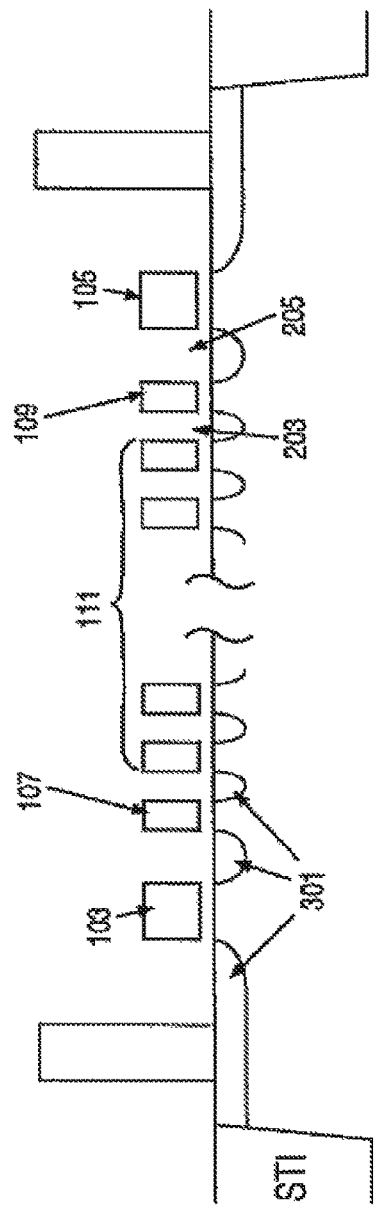
FIG. 3 shows a cross sectional view of the conventional NAND string shown in FIG. 1.
Figure 4:
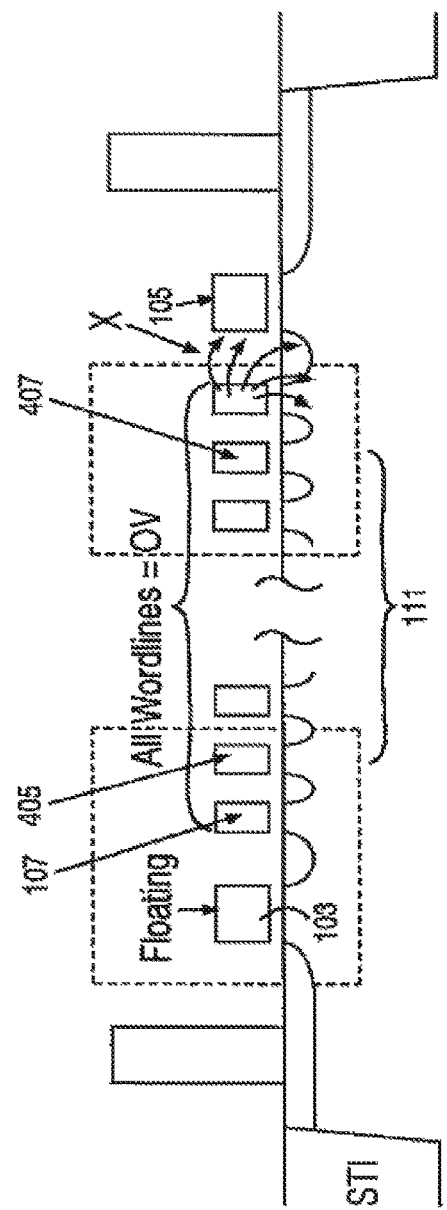
FIG. 4 illustrates the bias conditions of a conventional NAND string during erase operations.
Figure 5A:
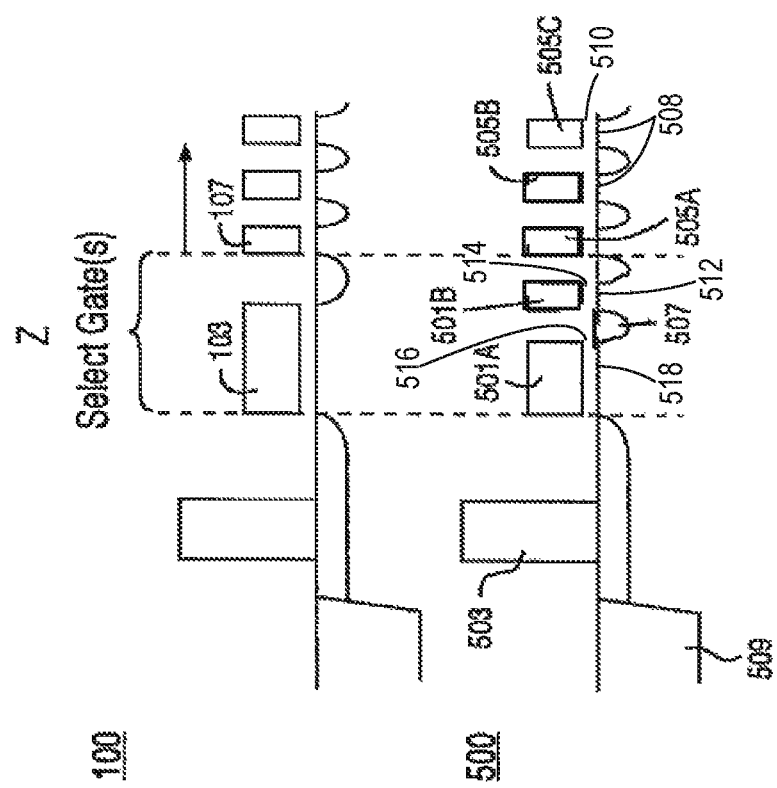
FIG. 5A compares a cross sectional view of a portion of the conventional NAND string shown in FIG. 4 and a cross sectional view of a portion of a non-even stacked select gate NAND string according to one embodiment.

FIG. 5A compares a cross sectional view of a portion of the conventional NAND string 100 shown in FIG. 4 and a cross sectional view of a portion of a non-even stacked select gate NAND string 500 structured in accordance with one embodiment. In one embodiment, the stacked gate arrangement shown in FIG. 5A provides both fab out and erasure Vt uniformity and facilitates the use of double patterning photolithography fabrication processes. In the FIG. 5 embodiment, NAND string 500 includes stacked select drain gate 501, source contact 503, core wordlines 505A, 505B and 505C, source-drain junctions 507, channels 508 and STI region 509. Generally, the core wordlines 505A, 505B and 505C serve as gates of memory transistors, which are separated from the channels 508 by a stack of layers 510 including a charge trapping layer (not shown in this figure.) In one embodiment, the memory transistor is a silicon-oxide-nitride-oxide-silicon (SONOS) memory transistor and the stack of layers is an oxide-nitride-oxide (ONO) stack in which a charge trapping layer includes a nitride layer, such as silicon nitride or silicon oxynitride, isolated from the channel 508 by a lower oxide tunneling layer and from the gate (core wordlines 505A, 505B and 505C) of the memory transistor by an upper oxide blocking layer.

Referring to FIG. 5A, stacked select drain gate 501 is separated into a larger 501A and a smaller 501B component. Because the select drain gate is separated in this manner (into multiple portions) it is referred to herein as being "stacked". In particular, the stacked select gate structure shown in FIG. 5A is referred to herein as a "double non-even stacked" select gate structure (because the select gate is separated into different sized portions).

Smaller 501B stacked select drain gate component is positioned adjacent to core wordlines 505A. 505B and 505C. In one embodiment, the spacing between smaller 501B stacked select drain gate component and the first wordline 505A of core wordlines 505A-505C is the same as that which exists between each of the individual wordlines of core wordlines 505A-505C. This is contrasted with the conventional NAND string structure 100 that features a different amount of spacing between select gate 103 and first wordline 107 than exists between first wordline 107 and other internal wordlines.

It should be appreciated that in the FIG. 5A embodiment, a select gate region, identified as Z in FIG. 5A, that occupies a space that extends from the leftmost surface of select gate 103 and the leftmost surface of first wordline 107 in conventional NAND string structure 100 is the same as that which exists between the leftmost surface of larger 501A stacked select gate component and the leftmost surface of first wordline 505A. Accordingly, the double non-even stacked select gate structure 500 of FIG. 5A requires no additional space in order to implement.

In certain alternative embodiments the wordline of the smaller stacked select gate component 501B, which functions as a gate of the smaller component, is separated from a channel 512 by a stack of layers 514 that also includes a charge trapping layer. In one version of this embodiment the stack of layers in the smaller stacked select gate component 501B has the same stoichiometric composition and thicknesses as the stack of layers 510 underlying the core wordlines 505A, 505B and 505C in the core of the NAND string structure 500. As mentioned above, the stack of layers 510 and 514 can be an oxide-nitride-oxide (ONO) stack in which a charge trapping layer includes a nitride layer.

The larger component 501A of the stacked select gate generally includes a single layer of a dielectric material or gate dielectric 516, such as silicon dioxide, separating the wordline of the larger component from an underlying channel 518.

Figure 5B:
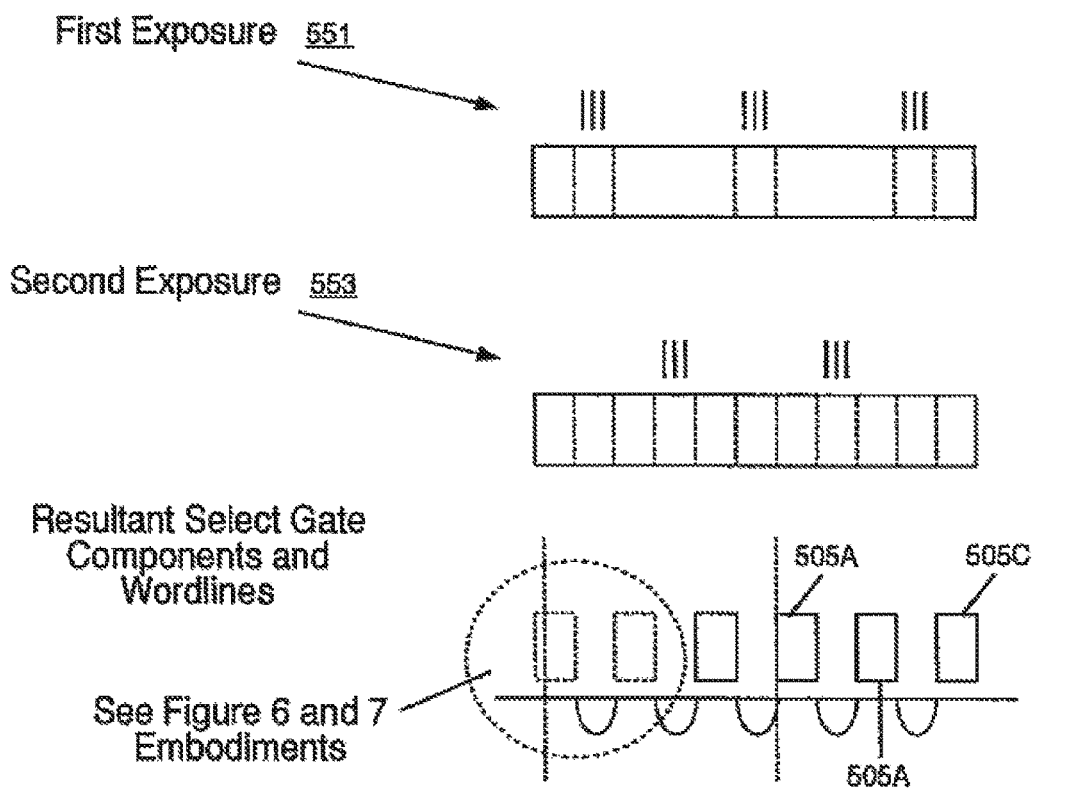
FIG. 5B illustrates operations in a double patterning photolithography process according to one embodiment.

The double non-even stacked select gate structure provides fab out and erasure Vt uniformity and facilitates the ready use of double patterning photolithography fabrication processes. Fab out Vt uniformity is ensured as the spacing between smaller 501B stacked select drain gate component and the first wordline 505A of core wordlines 505A-505C is the same as that which exists between each of the core wordlines 505A-505C. Moreover, erasure Vt uniformity is ensured as select gate component 501B is biased with the erase voltage such that first wordline 505A will have the same bias environment as the internal wordlines 505A-505C. In addition, the use of double patterning photolithography fabrication processes is facilitated as the stacked select gate arrangement provides spacing between select gate 501B and first wordline 505A that is the same as that which separates the other wordlines 505A-505C. It should be appreciated that wordlines and select gate structures that have equal spacing are ideal for fabrication using double patterning photolithography as wordline and select gate structures with such spacing are formed readily from the first and second exposures that are a part of double patterning photolithography as is illustrated in FIG. 5B. FIG. 5B shows that as a part of a photolithography process, first 551 and then second 553 exposures are performed. These exposures serve to define the select gate 501B and wordline components 505A-505C of the NAND string to have uniform pitch, which promotes fab out Vt uniformity. Consequently, the double non-even stacked select gate structure of FIG. 5A, provides a remedy to the fab out and erasure Vt uniformity and double patterning photolithography problems encountered by conventional NAND string structures.

Double Even Stacked Select Gate

Figure 6:
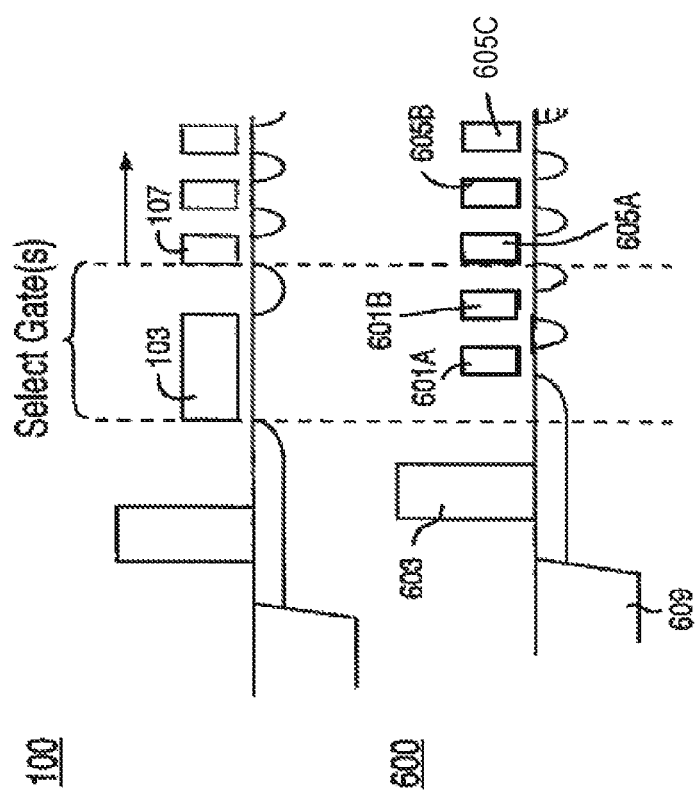
FIG. 6 compares a cross sectional view of a portion of conventional NAND string shown in FIG. 4 and a cross sectional view of a portion of a double even stacked select gate NAND string according to one embodiment.

FIG. 6 compares a cross sectional view of a portion of conventional NAND string 100 shown in FIG. 4 and a cross sectional view of a portion of a double even stacked select gate NAND string 600 structured in accordance with one embodiment. In one embodiment, the stacked gate arrangement shown in FIG. 6 provides both fab out and erasure Vt uniformity and facilitates the use of double patterning photolithography fabrication processes. In the FIG. 6 embodiment, NAND string 600 includes stacked select drain gate components 601A and 601B, source contact 603, core wordlines 605A, 605B and 605C, source drain junction 607 and STI region 609.

Referring to FIG. 6, stacked select drain gate 601 is separated into a first 601A and a second 601B component. Because the stacked select drain gate is separated in this manner (into multiple portions) in exemplary embodiments it is referred to as being "stacked", similar to the select gate structures discussed with reference to FIG. 5A. In particular, the stacked select gate structure shown in FIG. 6 is referred to as a "double even stacked" select gate structure (because the select gate is separated into two equally sized portions).

Second 601B stacked select drain gate component is positioned adjacent to core wordlines 605A-605C. In one embodiment, the spacing between second 601B stacked select drain gate component and the first wordline 605A of core wordlines 605A-605C is the same as that which exists between each of the core wordlines 605A-605C. This is contrasted with the conventional NAND string structure 100 that features a different amount of spacing between select gate 103 and first wordline 107 than exists between first wordline 107 and other internal wordlines of structure 100.

It should be appreciated that in the FIG. 6 embodiment, a select gate region that occupies a space less than that which extends from the leftmost surface of select gate 103 and the leftmost surface of first wordline 107 in conventional NAND string structure 100 in FIG. 4 is featured. Accordingly, the double even stacked select gate structure of FIG. 6 requires less space to accommodate its select gates than that which is required in the conventional NAND string structure shown in FIG. 4.

As mentioned above, the double even stacked select gate structure of NAND string 600 provides fab out and erasure Vt uniformity and facilitates the ready use of double patterning photolithography fabrication processes. Fab out Vt uniformity is ensured as the spacing between second 601B stacked select drain gate component and the first wordline 605A of core wordlines 605A-605C is the same as that which exists between each of the core wordlines 605A-605C. Moreover, erasure Vt uniformity is ensured as second 601B stacked select drain gate is biased with the erase voltage such that the first wordline 605A will have the same bias environment as internal wordlines 605B and 605C. In addition, the use of double patterning photolithography fabrication processes are facilitated as the stacked select gate arrangement provides spacing between select gate 601B and first wordline 605A that is the same as that which separates the other wordlines 605B and 605C. This is ideal for double patterning photolithography as wordline structures with equal spacing conveniently accommodates first and second exposures associated with printing the select gates and wordlines. Consequently, the double even stacked select gate structure provides a remedy to the fab out and erasure Vt uniformity problems in addition to the double patterning photolithography problems encountered by conventional NAND string structures.

Triple Even Stacked Select Gate

Figure 7:
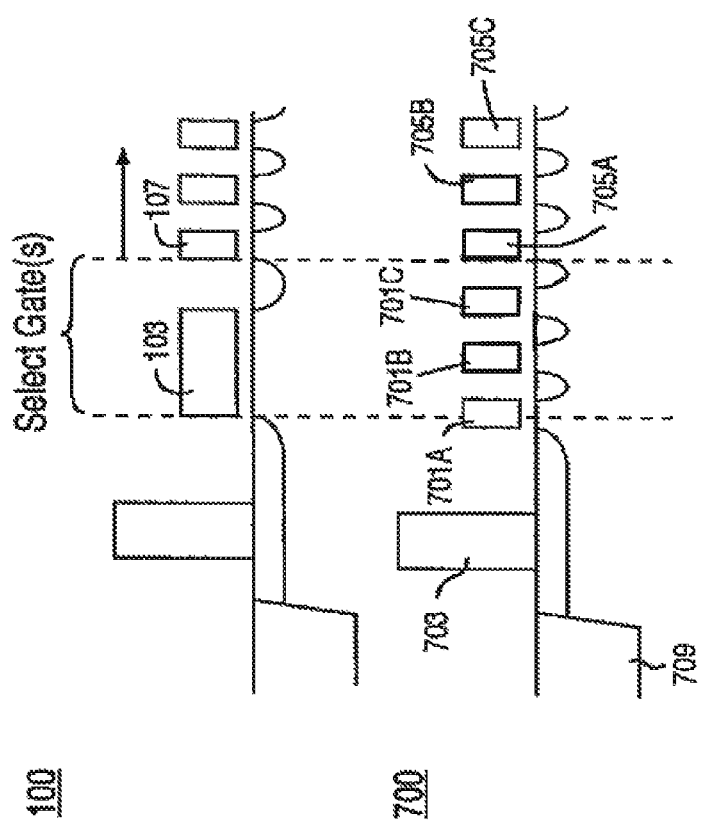
FIG. 7 compares a cross sectional view of a portion of conventional NAND string shown in FIG. 4 and a cross sectional view of a portion of a triple even stacked select gate NAND string according to one embodiment.

FIG. 7 compares a cross sectional view of a portion of conventional NAND string 100 shown in FIG. 4 and a cross sectional view of a portion of a triple even stacked select gate NAND string 700 according to one embodiment. In one embodiment, the stacked gate arrangement shown in FIG. 7 provides both fab out and erasure Vt uniformity and facilitates the use of double patterning photolithography fabrication processes. In the FIG. 7 embodiment, NAND string 700 includes stacked select drain gate 701A-701C, source contact 703, core wordlines 705A-705C, source-drain junction 707 and STI region 709.

Referring to FIG. 7, stacked select drain gate 701A-701C is separated into first 701A, second 701B and third 701C components. Because the stacked select drain gate is separated in this manner (into multiple portions) in exemplary embodiments, it is referred to herein as being "stacked". In particular, the stacked select gate structure shown in FIG. 7 is referred to herein as being a "triple even stacked" select gate structure (because the select gate is separated into three equal sized portions).

Third 701C stacked select drain gate component is positioned adjacent to core wordlines 705A-705C. In one embodiment, the spacing between third 701C stacked select drain gate component and first wordline 705A of core wordlines 705A-705C is the same as that which exists between each of the core wordlines 705A-705C. This is contrasted with the conventional NAND string structure 100 that features a different amount of spacing between first wordline 107 and select gate 103 than exists between first wordline 107 and other internal wordlines.

It should be appreciated that in the FIG. 7 embodiment, a select gate region that occupies a space that extends from the leftmost surface of select gate and the leftmost surface of first wordline in conventional structure is very similar to that which extends from the leftmost surface of first 701A stacked select gate component and the leftmost surface of first wordline of core wordlines 705A. Accordingly, the triple even stacked select gate structure of FIG. 7 requires very little space in addition to that which is required to accommodate the gate structure 103 of conventional NAND structure 100.

As mentioned above, the triple even stacked select gate structure of NAND string 700 provides fab out and erasure Vt uniformity and facilitates the use of double patterning photo lithography fabrication processes. Fab out Vt uniformity is ensured as the spacing between third 701C stacked select drain gate component and first wordline 705A of core wordlines 705A-705C is the same as that which exists between each of the core wordlines 705A-705C. Moreover, erasure Vt uniformity is ensured as 701C is biased with the erase voltage such that the first wordline 705A will have the same bias environment as internal wordlines 705B and 705C. In addition, the use of double patterning photolithography fabrication processes is facilitated as the triple even stacked select gate arrangement provides spacing between select gate 701C and first wordline 705A that is the same as that which separates the wordlines 705B and 705C. This is ideal for double patterning photolithography as select gate and wordline structures with equal spacing conveniently accommodate a first and second exposure associated with the printing of the select gates and wordlines (see FIG. 5B) that is a part of the double patterning photolithography process. Consequently, the triple even stacked select gate structure provides a remedy to both the fab out and erasure Vt uniformity problem and the double patterning photolithography problems encountered by conventional NAND string structures.

Figure 8:
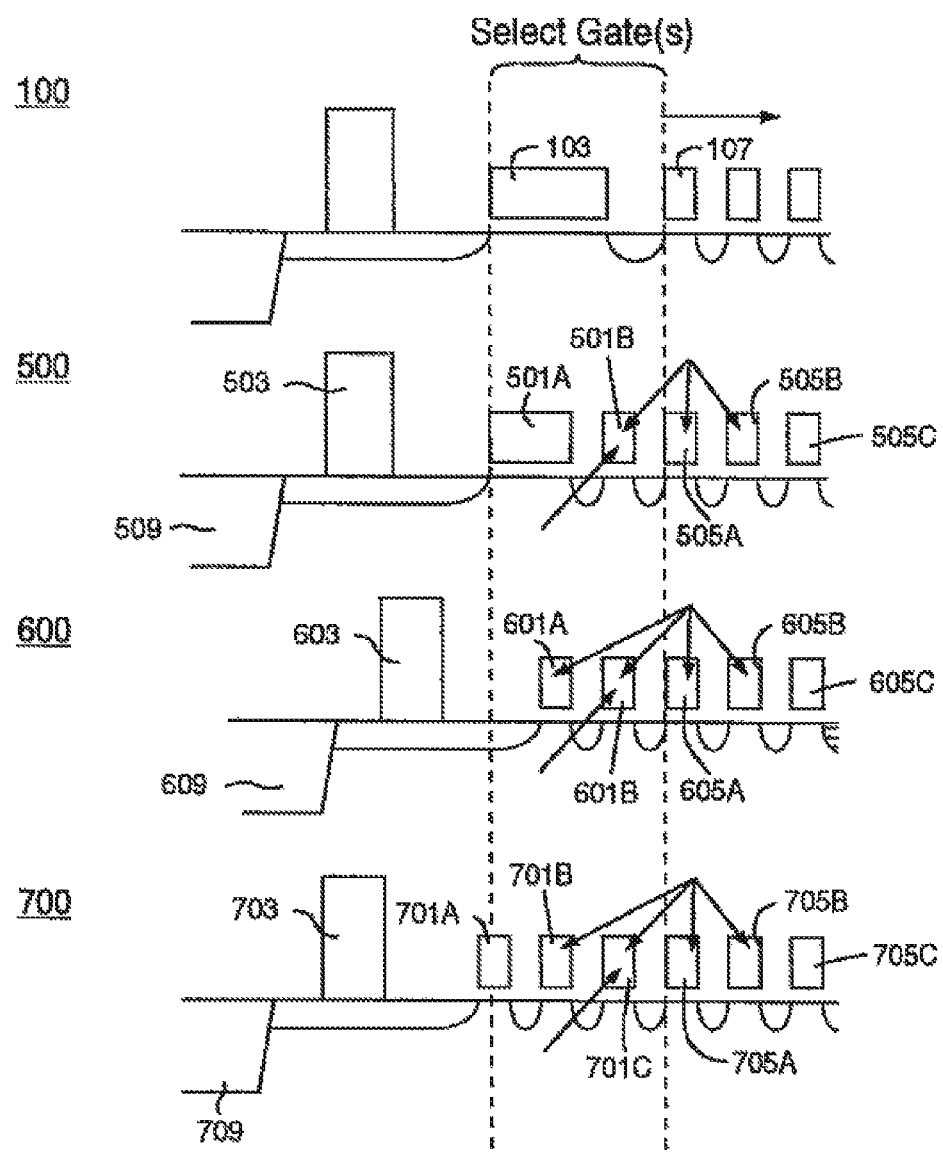
FIG. 8 shows the multiple stacked select gate approaches discussed with reference to FIGS. 5A-7 side by side.

FIG. 8 juxtaposes the exemplary multiple stacked select gate structures discussed with reference to FIGS. 5A-7 with the conventional NAND string structure 100 discussed with reference to FIG. 4. It should be appreciated that the various "stacked gate select transistors" approaches discussed with reference to FIGS. 5A-7 provide full or partial solutions to conventional NAND string problems that include but are not limited to: (1) fab out Vt uniformity, (2) erasure Vt uniformity and (3) the use of double patterning photo lithography fabrication processes. As it regards the FIG. 5A embodiment, the double non-even stacked select gate structure embodied therein, as mentioned above, provides fab out and erasure Vt uniformity and facilitates the use of double patterning photolithography fabrication processes. As it regards the FIG. 6 embodiment, the double even stacked select gate structure embodied therein, as mentioned above, provides fab out and erasure Vt uniformity and facilitates the use of double patterning photolithography fabrication processes. The double even stacked select gate structure provides enhanced accommodation of double patterning photolithography as both the select gate 601A and 601B and wordline structures 605A-605C are equally spaced to conveniently accommodate first and second exposures (see FIG. 5B) for patterning that are a part of double patterning photolithography processing. As it regards the FIG. 7 embodiment, the triple even stacked select gate structure embodied therein, as mentioned above, provides fab out Vt and erasure Vt uniformity and facilitates the use of double patterning photolithography fabrication processes. Furthermore, the triple even stacked select gate structure provides an enhanced control of the electric field that can be applied to the first wordline of a NAND string due to the triple stacked gate structure which features an additional select gate component which provides an additional measure of electric field control.

Exemplary embodiments, as discussed herein, feature select gates that include multiple stacked gate components including one or more stacked gate components (see FIGS. 5-7) that act as voltage and spacing uniformity facilitating components. In one embodiment, the gate length of the uniformity facilitating select gate component (e.g., 501B, 601B and 701C) located adjacent to the first and last wordlines has the same dimension (gate length and gate spacing) as those of the internal wordlines. This uniformity facilitating select gate component ensures fab-out Vt uniformity as discussed herein. During erase operation, the uniformity facilitating select gate component can be biased, as discussed herein, with an erase voltage so that the first and last wordlines have the same bias environment as internal wordlines. Thus, a uniform erase rate throughout the entire NAND string is provided. As it regards the double patterning process that is used to define select gates and wordlines, exemplary embodiments by providing the equal spacing that is discussed herein, eliminate the difficulty of having various poly spacing within the NAND structure as is shown in the FIG. 6 and FIG. 7 embodiments.

Figure 9:
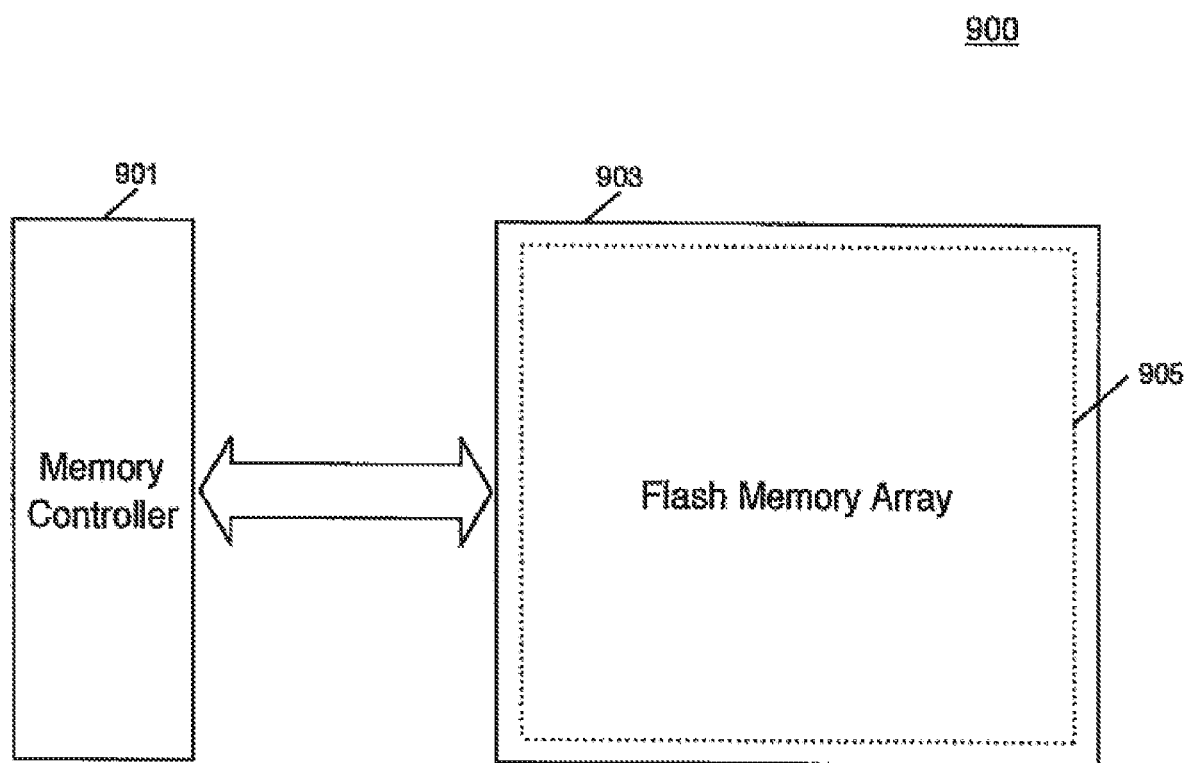
FIG. 9 shows an exemplary operating environment of stacked select gate NAND string structures according to one embodiment.

FIG. 9 shows an exemplary operating environment 900 of the stacked select gate NAND string structures discussed herein. FIG. 9 shows memory controller 901 and flash memory array 903 which includes stacked select gate NAND string structures 905. Referring to FIG. 9 memory controller 901 controls data going to and from flash memory array 903. The NAND string structure that constitutes flash memory array 903 features uniform fab-out Vt distribution and uniform erase Vt distribution (utilizing multiple stacked gate select transistors as discussed herein) and simplifies double patterning photolithography.

Figure 10:
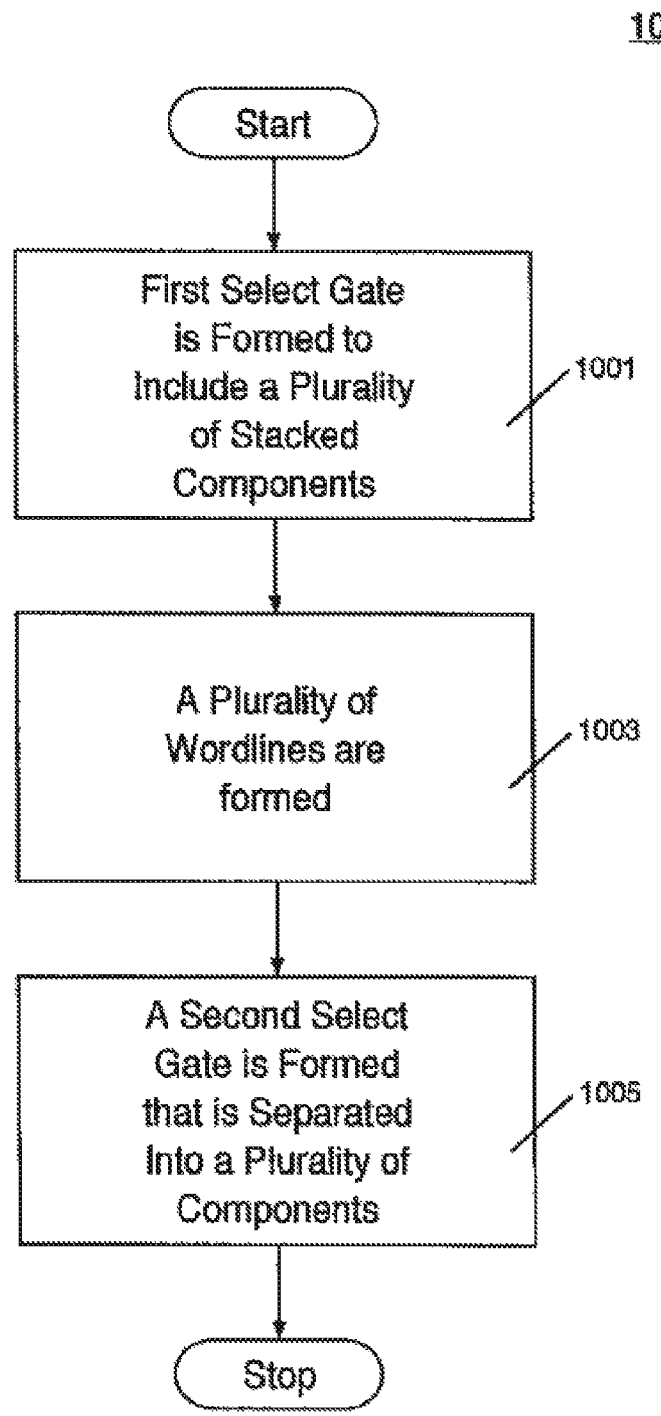
FIG. 10 shows a flowchart of steps performed in a process for forming a NAND string having a stacked select gate structure according to one embodiment.

Process for Forming a Nand Memory Cell String Having a Stacked Select Gate Structure FIG. 10 shows a flowchart 1000 of the steps performed in a process for forming a NAND string having a stacked select gate structure according to one embodiment. Although specific steps are disclosed in the flowcharts, such steps are exemplary. That is the present invention is well suited to performing various other steps or variations of the steps recited in the flowcharts. Moreover, no temporal relationship of the steps is intended to be suggested. For example, one or more or all of the steps that are described below can be performed simultaneously or substantially simultaneously. Within various embodiments, it should be appreciated that the steps of the flowcharts can be performed by various semiconductor fabrication processes.

Referring to FIG. 10, at 1001, a first select gate is formed to include a plurality of separate "stacked" components or parts. In one embodiment, the select gate can be formed to include two uneven parts referred to herein as an "uneven stacked" select gate structure (because the select gate is separated into two non-equally sized portions). In another embodiment, the select gate can be formed to include two even parts referred to herein as a "double even stacked" select gate structure (because the select gate is separated into two equal sized portions). In yet another embodiment, the select gate can be formed to include three even parts referred to herein as a "triple even stacked" select gate structure (because the select gate is separated into three equal sized portions).

At 1003, a plurality of wordlines (e.g., 8, 16, 32, 64, etc., core wordlines) are formed wherein the plurality of wordlines are coupled to the first select gate.

At 1005, a second select gate is formed that is separated into a plurality of components or parts. Both the first and the second select gates include one component that is positioned adjacent to the plurality of wordlines. In one embodiment, the spacing between this component and the adjacent wordline of core wordlines is the same as that which exists between each of the core wordlines. In one embodiment, double patterning photolithography can be used in the formation of the structures discussed with reference to 1003-1005. In other embodiments, other fabrication techniques and processes can be used.

Alternative Implementations

In another aspect the present disclosure is directed to memory strings including multigate or multigate-surface memory devices or transistors including charge-trapping layers overlying two or more sides of a channel formed on or above a surface of a substrate. Multigate devices include both planar and non-planar devices. A planar multigate device generally includes a double-gate planar device in which a number of first layers are deposited to form a first gate below a subsequently formed channel, and a number of second layers are deposited thereover to form a second gate. A non-planar multigate device generally includes a horizontal or vertical channel formed on or above a surface of a substrate and surrounded on three or more sides by a gate.

Figure 11A:
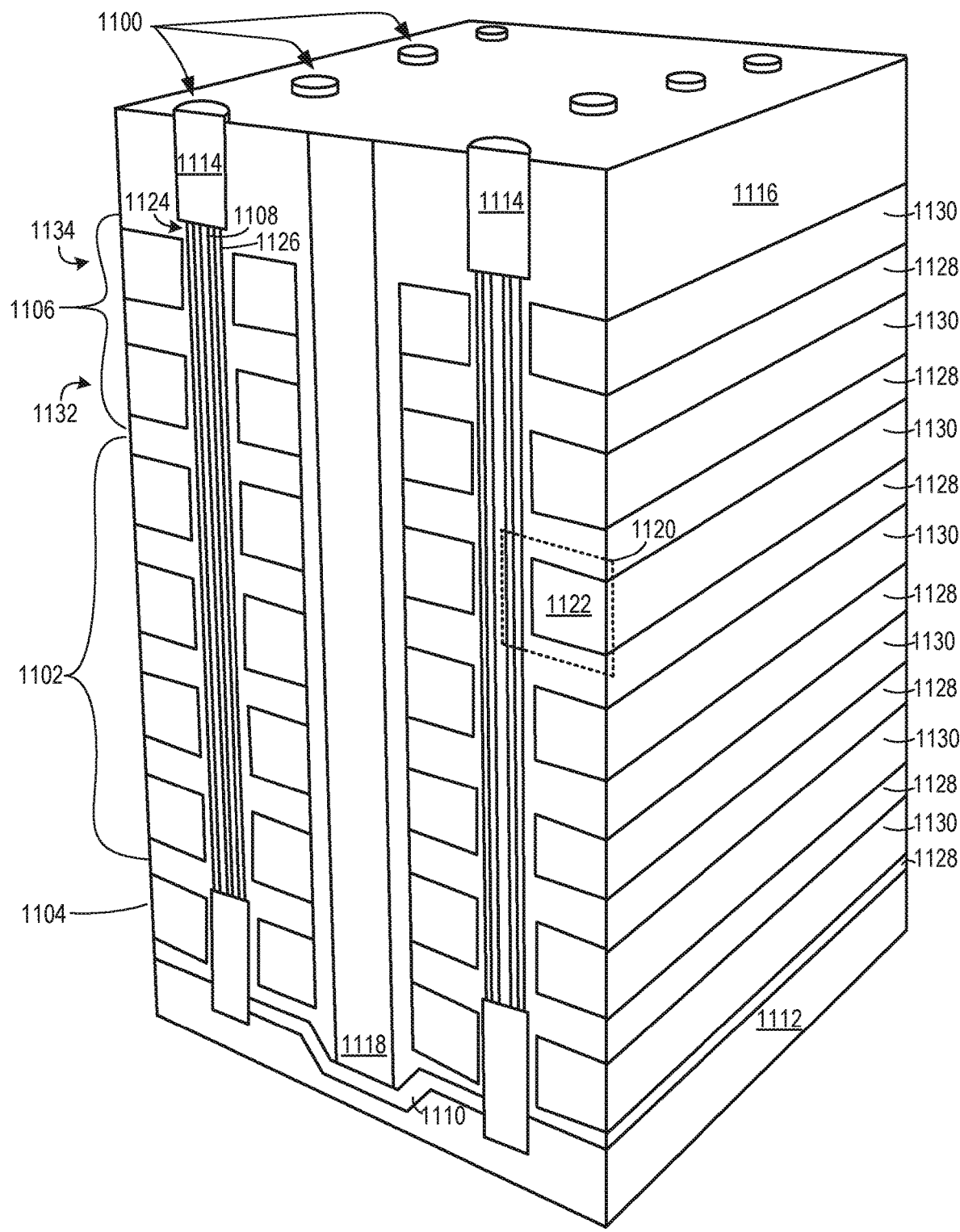
FIG. 11A shows a sectional perspective view of multiple three dimensional (3D) NAND strings according to one embodiment.
Figure 11B:
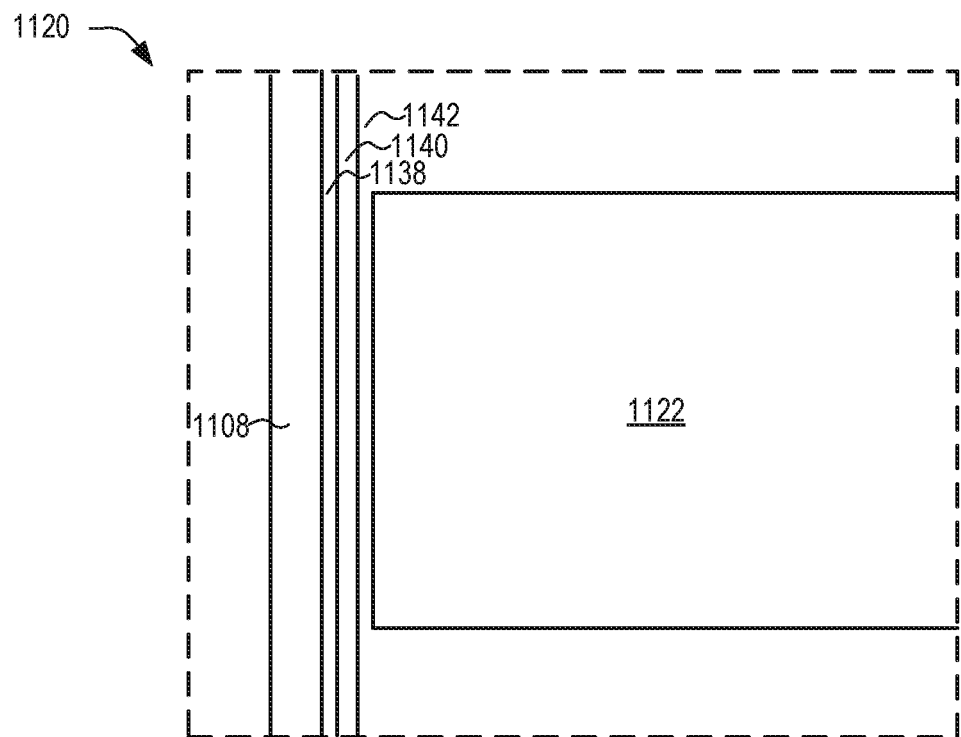
FIGS. 11B and 11C show cross-sectional view of a SONOS transistor in the 3D NAND string in FIG. 11A according to different embodiments.

FIG. 11A illustrates a sectional perspective view one embodiment of multiple three dimensional (3D) NAND memory strings 1100 including a stacked select gate. Referring to FIG. 11A, each memory string 1100 includes a plurality of core cells 1102 serially connected between a top or drain select gate 1104 and a bottom or source select gate 1106 along a shared or common cylindrical channel 1108 extending vertically from an array common source (ACS) 1110 in a substrate 1112 to drain plugs or drains 1114 formed in an upper insulating layer 1116. The common source 1110 is electrically coupled to an ACS contact 1118 extending through layers forming the core cells and the upper insulating layer 1116.

Each core cell includes a non-planar or three dimensional (3D) memory device or transistor 1120 including a gate 1122 formed by an internal wordline of the plurality of core cells 1102, and separated from the channel 1108 by a stack of layers 1124 including a charge trapping layer 1126. The internal wordlines/gates 1122 of the memory transistor 1120 are formed by depositing alternating layers of a dielectric material 1128, such as silicon dioxide, and a conducting material 1130 or alloy, such as tungsten titanium-nitride (W/TiN), over a surface of the substrate 1112 in which the ACS 1110 formed. The channel 1108 and the ACS contact 1118 can be formed by anisotropically etching openings through the upper insulating layer 1116 and the layers of dielectric material 1126 and conducting material 1128 using standard photolithographic techniques, and filling the openings with polysilicon using chemical vapor deposition (CVD).

In accordance with present disclosure, the top or drain select gate 1104 and/or the bottom or source select gate 1106 are stacked select gates including multiple components or elements.

In the embodiment shown in FIG. 11A both the drain select gate 1104 and the bottom source select gate are double, even stacked select gate. Referring to FIG. 11A the drain select gate 1104 includes a first component 1132 adjacent to the core cells 1102 and a second component 1134 of substantially the same size as the first component separated from the core cells by the first component. Although in the embodiment of FIG. 11A the first component 1132 is similar in size to the memory transistors 1120 of the core cells 1102, it will be understood that this need not be the case, and in certain embodiments the first component may be larger or smaller than the memory transistors. The first component 1132 includes a gate 1136 separated from the shared channel 1108 by the stack of layers 1124 including the charge trapping layer 1126. Similarly, the second component 1134 also includes a gate 1138 separated from the shared channel 1108 by the stack of layers 1124 including the charge trapping layer 1126. Generally, the stack of layers 1124 and charge trapping layer 1126 underlying the gate 1136 of the first component 1132 have the same stoichiometric composition and thicknesses as the stack of layers underlying the internal wordlines or gates 1122 of the memory transistors 1120 in the plurality of core cells 1102.

In the embodiment shown the source select gate 1106 is also a double, even stacked select gate including a first component 1142 adjacent to the core cells 1102 and a second component 1144 of substantially the same size as the first component separated from the core cells by the first component. Although in the embodiment of FIG. 11A the source select gate 1106 is similar to the drain select gate 1104 in size and number of components, it will be understood that this need not be the case, and in certain embodiments the source select gate 1106 may include a different number or larger or smaller components than the drain select gate 1104. As with the first component 1132 of the drain select gate 1104 the first component 1142 of the source select gate 1106 generally includes a gate 1146 separated from the shared channel 1108 by the stack of layers 1124 including the charge trapping layer 1126.

The second component 1144 includes a gate 1148 separated from the shared channel 1108 by a gate dielectric 1150 not including the charge trapping layer 1126. The gate dielectric 1150 can include a portion of the dielectric material 1128, as in the embodiment shown, or a separate layer of a dielectric material, such as a silicon oxide formed over or surrounding the shared channel 1108.

In one version of the above embodiment, shown in 11B, the memory transistors 1120, the first and second components 1132, 1134, of the drain select gate 1104 and the first component 1142 of the source select gate 1106 are silicon-oxide-nitride-oxide-silicon (SONOS) devices including a portion of the shared channel 1108 surrounded by a tunnel oxide layer 1152, a portion of the charge trapping layer 1126, a blocking layer 1154 and a polysilicon or metal wordline/gate 1122/1136/1138/1146 surrounding the blocking layer. The blocking layer 1154 can include a portion of the dielectric material 1128 formed between the memory transistors 1120 of the core cells 1102, as in the embodiment shown, or a separate layer of a dielectric material, such as an oxide formed over or surrounding the charge trapping layer 1126. The charge trapping layer 1126 can include silicon nitride or silicon oxynitride, and can be formed, for example, by a chemical vapor deposition (CVD) process. The channel 1108 can include an annular region in an outer layer of a substantially solid cylinder of semiconducting material, or can include an annular layer formed over a cylinder of dielectric filler material. The channel 1108 can include polysilicon or recrystallized polysilicon to form a monocrystalline channel.

Figure 11C:
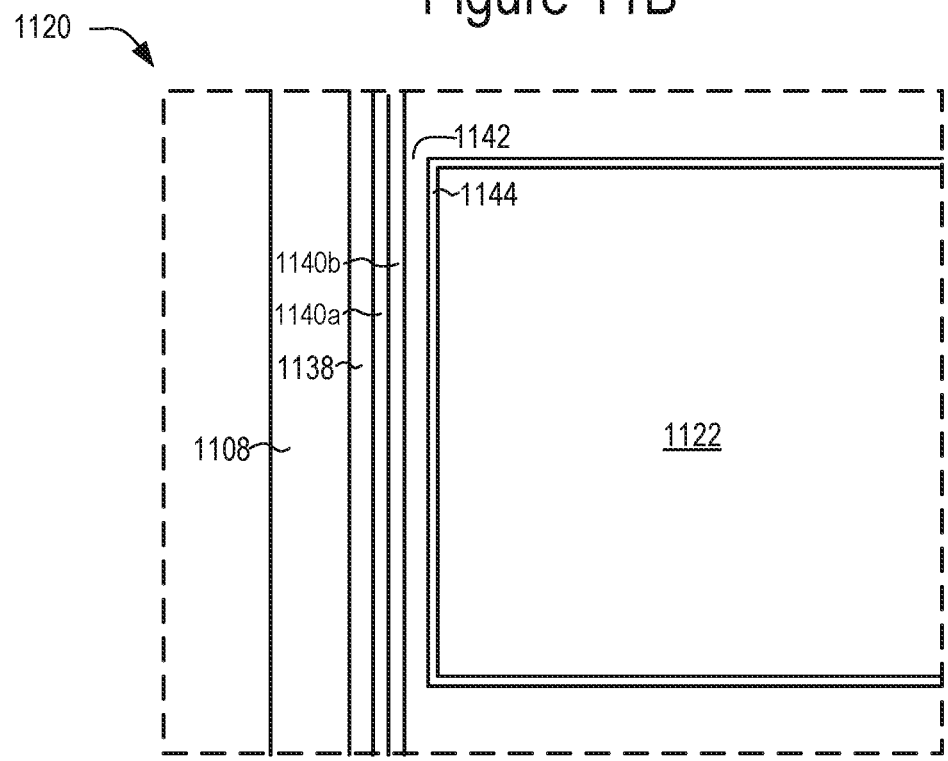

In an alternative embodiment, shown in FIG. 11C, the charge trapping layer 1126 is a multilayer charge trapping layer including at least a first or inner charge trapping layer 1126a closest to the tunnel oxide layer 1152, and a second or outer charge trapping layer 1126b. Generally, the second or outer charge-trapping layer 1126b includes a silicon-rich, oxygen-lean nitride layer and contains a majority of charge traps distributed in the multilayer charge-trapping layer, while the first or inner charge-trapping layer 1126a includes a nitride or silicon oxynitride, which is oxygen-rich relative to the top charge-trapping layer to reduce the number of charge traps therein.

It has been found that an oxygen-rich, oxynitride or nitride layer includes fewer charge traps than an oxygen-lean layer, moving trapped charges further from the channel, which decreases charge losses through the tunnel oxide layer 1152 after programming and/or erasing without impacting speed, thereby extending the operating life of the memory transistor 1120. By oxygen-rich it is meant wherein a concentration of oxygen in the inner first or charge-trapping layer 1126a is from about 15 to about 40%, whereas a concentration of oxygen in the outer or second charge-trapping layer 1126b is less than about 5%.

Optionally, the first and second charge trapping layers can be separated by an intermediate oxide or anti-tunneling layer, not shown in this figure, to further decrease charge losses.

Either or both of the first charge trapping layer 1126a and the second charge trapping layer 1126b can include silicon nitride or silicon oxynitride, and can be formed, for example, by a CVD process including $N_2O/NH_3$ and $DCS/NH_3$ gas mixtures in ratios and at flow rates tailored to provide an oxygen-rich or an oxygen lean layer.

Finally, the stack of layers 1124 may further include a high K dielectric layer 1158, such as HfSiON, HfSiO, HfO, ZrSiON, ZrSiO, ZrO, or $Y_2O_3$, either overlying the blocking layer 1154 or surrounding the gate 1122.

A suitable thickness for the first charge trapping layer 1126a may be from about 30 Å to about 80 Å (with some variance permitted, for example ±10 Å), of which about 5-20 Å may be consumed by radical oxidation to form an anti-tunneling layer not shown). A suitable thickness for the second charge trapping layer 1126b may be at least 30 Å, and a suitable thickness for the blocking layer 1154 may be from about 30-70 Å.

In another alternative embodiment, shown schematically in FIG. 12A, the NAND memory string 1200 includes a plurality of core cells 1202 serially connected between a drain select gate 1204 and a source select gate 1206, in which both the drain select gate and source select gate are a double, uneven stacked select gates. Referring to FIG. 12A the drain select gate 1204 includes a smaller, first component 1208 adjacent to the core cells 1202 and a larger, second component 1210 separated from the core cells by the first component. Generally, both the first component 1208 and the second component 1210 include a first gate 1212 separated from a channel by a stack of layers (not shown) including a charge trapping layer 1214, shown schematically in this figure. As noted above, stack of layers including the charge trapping layer 1214 in the first and second components 1208, 1210, may have the same stoichiometric composition and thicknesses as a stack of layers (not shown) underlying the wordlines/gates 1216 in the plurality of core cells 1202.

The source select gate 1206 is also a double, uneven stacked select gate and includes a first component 1218 adjacent to the core cells 1202 and a second component 1220 of substantially the same size as the first component separated from the core cells by the first component. Like the first component 1208 of the drain select gate 1204, the first component 1218 of the source select gate 1206 generally includes a gate 1222 separated from the shared channel by the stack of layers (not shown) including the charge trapping layer 1214, shown schematically in this figure.

As in the embodiment shown in FIG. 11A, the second component 1220 of the source select gate 1206 includes a gate 1224 separated from the shared channel by a gate dielectric 1226, shown schematically in this figure, not including the charge trapping layer 1214.

Although in the embodiment of FIG. 12A the source select gate 1206 is similar to the drain select gate 1204 in size and number of components, it will be understood that this need not be the case, and in certain embodiments the source select gate 1206 may include a different number or larger or smaller components than the drain select gate 1204.

In yet another alternative embodiment, shown schematically in FIG. 12B, both the drain select gate 1204 and the source select gate 1206 are triple stacked select gates including multiple components or elements. As noted above, the components of the stacked select gates can be either even, having substantially the same size, or uneven, having different sizes, and can include two or more components in each of the stacked select gates. In the embodiment shown in FIG. 12B both the drain select gate 1204 and the source select gate 1206 are triple even stacked select gates, each having three components of substantially the same size. However, it will be understood that either or both of the drain select gate 1204 and the source select gate 1206 can include fewer components of the same or different sizes to provide double even, double uneven or triple uneven stacked select gates.

Referring to FIG. 12B the drain select gate 1204 includes a first component 1208 adjacent to the core cells 1202 and two second components 1210 separated from the core cells by the first component. Generally, both the first component 1208 and the second components 1210 include a first gate 1212 separated from a channel by a stack of layers (not shown) including a charge trapping layer 1214, shown schematically in this figure. As noted above, stack of layers including the charge trapping layer 1214 in the first component 1208 and second components 1210, may have the same stoichiometric composition and thicknesses as a stack of layers (not shown) underlying the wordlines/gates 1216 in the plurality of core cells 1202.

The source select gate 1206 is also a triple, even stacked select gate and includes a first component 1218 adjacent to the core cells 1202 and second components 1220 of substantially the same size as the first component separated from the core cells by the first component. Like the first component 1208 of the drain select gate 1204, the first component 1218 of the source select gate 1206 generally includes a gate 1222 separated from the shared channel by the stack of layers (not shown) including the charge trapping layer 1214, shown schematically in this figure.

The second components 1220 of the source select gate 1206, like the embodiments shown in FIGS. 11A and 12A, include gates 1224 separated from the shared channel by a gate dielectric (not shown) not including the charge trapping layer 1214.

Thus, a memory cell string has been disclosed with reference to exemplary embodiments thereof. The memory cell string includes a first select gate that includes a first plurality of elements. A plurality of wordlines are coupled to the first select gate and second select gate that includes a second plurality of elements is coupled to the plurality of wordlines. The distances between one element of the first and the second plurality of elements and the plurality of wordlines are the same as the distances that exist between each wordline of the plurality of wordlines.

Although many of the components and processes are described above in the singular for convenience, it will be appreciated by one of skill in the art that multiple components and repeated processes can also be used to practice the techniques of the present invention. Further, while the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

What is claimed is:

1. A memory string, comprising:
   a plurality of core cells serially connected between a source select gate and a drain select gate along a channel, each core cell including an internal wordline separated from the channel by a first stack of layers including a charge trapping layer comprising a nitride;
   at least one of the source and drain select gates is a stacked select gate comprising a plurality of components, including a first component adjacent to the plurality of core cells and a second component separated from the plurality of core cells by the first component; and
   wherein the first component comprises a first gate separated from the channel by a second stack of layers having the same stoichiometric composition and thicknesses as the first stack of layers, and the second component comprises a second gate separated from the channel by a gate dielectric not including a charge trapping layer.

2. The memory string of claim 1 wherein the stacked select gate is a triple stacked select gate further comprising a third component separated from the plurality of core cells by the first component and the second component.

3. The memory string of claim 1 wherein the charge trapping layer is a bilayer charge trapping layer comprising a substantially trap-free, oxygen-rich first nitride layer overlying the channel, and a trap-dense, oxygen-lean second nitride layer overlying the first nitride layer.

4. The memory string of claim 1 wherein the memory string comprises a vertical NAND memory string, wherein the channel comprises a polysilicon cylinder extending vertically from a source in a substrate to a drain overlying the substrate.

5. The memory string of claim 1 wherein the first gate of the first component and the second gate of the second component comprise a same size.

6. The memory string of claim 1 wherein the first gate of the first component and the second gate of the second component comprise a different size.

7. The memory string of claim 1 wherein the first gate is configured to be biased during an erase operation with an erase voltage to have a same bias environment as the internal wordlines of the plurality of core cells to provide erasure threshold voltage uniformity.

8. The memory string of claim 7 wherein the first gate and the internal wordlines are configured to be biased with a same erase voltage during an erase operation.

9. A memory string, comprising:
- a plurality of core cells serially connected between a source select gate and a drain select gate along a channel, each core cell including an internal wordline separated from the channel by a first oxide-nitride-oxide (ONO) stack; and
- at least one of the source and drain select gates is a stacked select gate comprising a plurality of components, including a first component adjacent to the plurality of core cells and a second component separated from the plurality of core cells by the first component,
- wherein the channel comprises a polysilicon cylinder extending vertically from a source in a substrate to a drain overlying the substrate.

10. The memory string of claim 9 wherein the first component comprises a first gate separated from the channel by a second ONO stack, and the second component comprises a second gate separated from the channel by a gate dielectric.

11. The memory string of claim 10 wherein the second ONO stack has the same stoichiometric composition and thicknesses as the first ONO stack.

12. The memory string of claim 9 wherein the stacked select gate is a triple stacked select gate further comprising a third component separated from the plurality of core cells by the first component and the second component.

13. The memory string of claim 9 wherein the charge trapping layer is a bilayer charge trapping layer comprising a substantially trap-free, oxygen-rich first nitride layer overlying the channel, and a trap-dense, oxygen-lean second nitride layer overlying the first nitride layer.

14. The memory string of claim 9 wherein the first gate of the first component and the second gate of the second component comprise a same size.

15. The memory string of claim 9 wherein the first gate of the first component and the second gate of the second component comprise a different size.

16. The memory string of claim 9 wherein the first gate is configured to be biased during an erase operation with an erase voltage to have a same bias environment as the internal wordlines of the plurality of core cells to provide erasure threshold voltage uniformity.

17. The memory string of claim 16 wherein the first gate and the internal wordlines are configured to be biased with a same erase voltage during an erase operation.

18. A memory string, comprising:
- a plurality of core cells serially connected between a source select gate and a drain select gate along a channel, each core cell including an internal wordline separated from the channel by a first stack of layers including a charge trapping layer comprising a nitride;
- at least one of the source and drain select gates is a stacked select gate comprising a plurality of components, including a first component adjacent to the plurality of core cells and a second component separated from the plurality of core cells by the first component; and
- wherein the second component comprises a second gate separated from the channel the channel by a single layer gate dielectric.

19. The memory string of claim 18 wherein the memory string comprises a vertical NAND memory string, wherein the channel comprises a polysilicon cylinder extending vertically from a source in a substrate to a drain overlying the substrate.

20. The memory string of claim 18 wherein the first component comprises a first gate separated from the channel by a second stack of layers having the same stoichiometric composition and thicknesses as the first stack of layers.

* * * * *